United States Patent
Khatri et al.

(10) Patent No.: US 11,093,419 B2
(45) Date of Patent: Aug. 17, 2021

(54) SYSTEM AND METHOD FOR COST AND POWER OPTIMIZED HETEROGENEOUS DUAL-CHANNEL DDR DIMMS

(71) Applicant: DELL PRODUCTS, LP, Round Rock, TX (US)

(72) Inventors: Mukund P. Khatri, Austin, TX (US); Vadhiraj Sankaranarayanan, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 15/484,735

(22) Filed: Apr. 11, 2017

(65) Prior Publication Data
US 2018/0293012 A1 Oct. 11, 2018

(51) Int. Cl.
*G06F 13/16* (2006.01)
*G11C 5/04* (2006.01)

(52) U.S. Cl.
CPC .......... *G06F 13/1684* (2013.01); *G06F 13/16* (2013.01); *G11C 5/04* (2013.01)

(58) Field of Classification Search
CPC .... G06F 3/0629; G06F 3/0679; G06F 3/0604; G11C 3/0604
See application file for complete search history.

(56) References Cited

U.S. PATENT DOCUMENTS

| | | | |
|---|---|---|---|
| 8,495,330 B2 | 7/2013 | Vergis et al. | |
| 9,417,802 B1 | 8/2016 | Berke et al. | |
| 2009/0198874 A1* | 8/2009 | Tzeng | G06F 12/0246 711/103 |
| 2015/0359148 A1 | 12/2015 | Patti et al. | |
| 2016/0118121 A1 | 4/2016 | Kelly et al. | |
| 2017/0206033 A1* | 7/2017 | Ma | G06F 3/061 |
| 2017/0256295 A1* | 9/2017 | Patel | G11C 7/1072 |
| 2017/0344311 A1* | 11/2017 | Oh | G06F 3/0659 |

OTHER PUBLICATIONS

"XED: Exposing On-Die Error Detection Information for Strong Memory Reliability," Prashant J. Nair et al., ISCA-43, Advanced Micro Devices Inc., Jun. 20, 2016, pp. 1-13.

* cited by examiner

*Primary Examiner* — Mohammed A Bashar
(74) *Attorney, Agent, or Firm* — Larson Newman, LLP

(57) ABSTRACT

A dual-channel Dual In-Line Memory Module (DIMM) includes a first memory element configured to perform memory transactions for first memory locations associated with the first memory element via a first memory channel of the dual-channel DIMM, and a second memory element configured to perform memory transactions for second memory locations associated with the second memory element via a second memory channel of the dual-channel DIMM, wherein the first memory channel is different than the second memory channel, and wherein the first memory element is a different type of memory element than the second memory element.

20 Claims, 4 Drawing Sheets

SYSTEM AND METHOD FOR COST AND POWER OPTIMIZED HETEROGENEOUS DUAL-CHANNEL DDR DIMMS

FIELD OF THE DISCLOSURE

This disclosure generally relates to information handling systems, and more particularly relates to cost and power optimized heterogeneous dual-channel DDR DIMMs.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A dual-channel Dual In-Line Memory Module (DIMM) may include a first memory element configured to perform memory transactions for first memory locations associated with the first memory element via a first memory channel of the dual-channel DIMM, and a second memory element independent from the first memory element and configured to perform memory transactions for second memory locations associated with the second memory element via a second memory channel of the dual-channel DIMM. The first memory channel may be different than the second memory channel, and the first memory element may be a different type of memory element than the second memory element.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
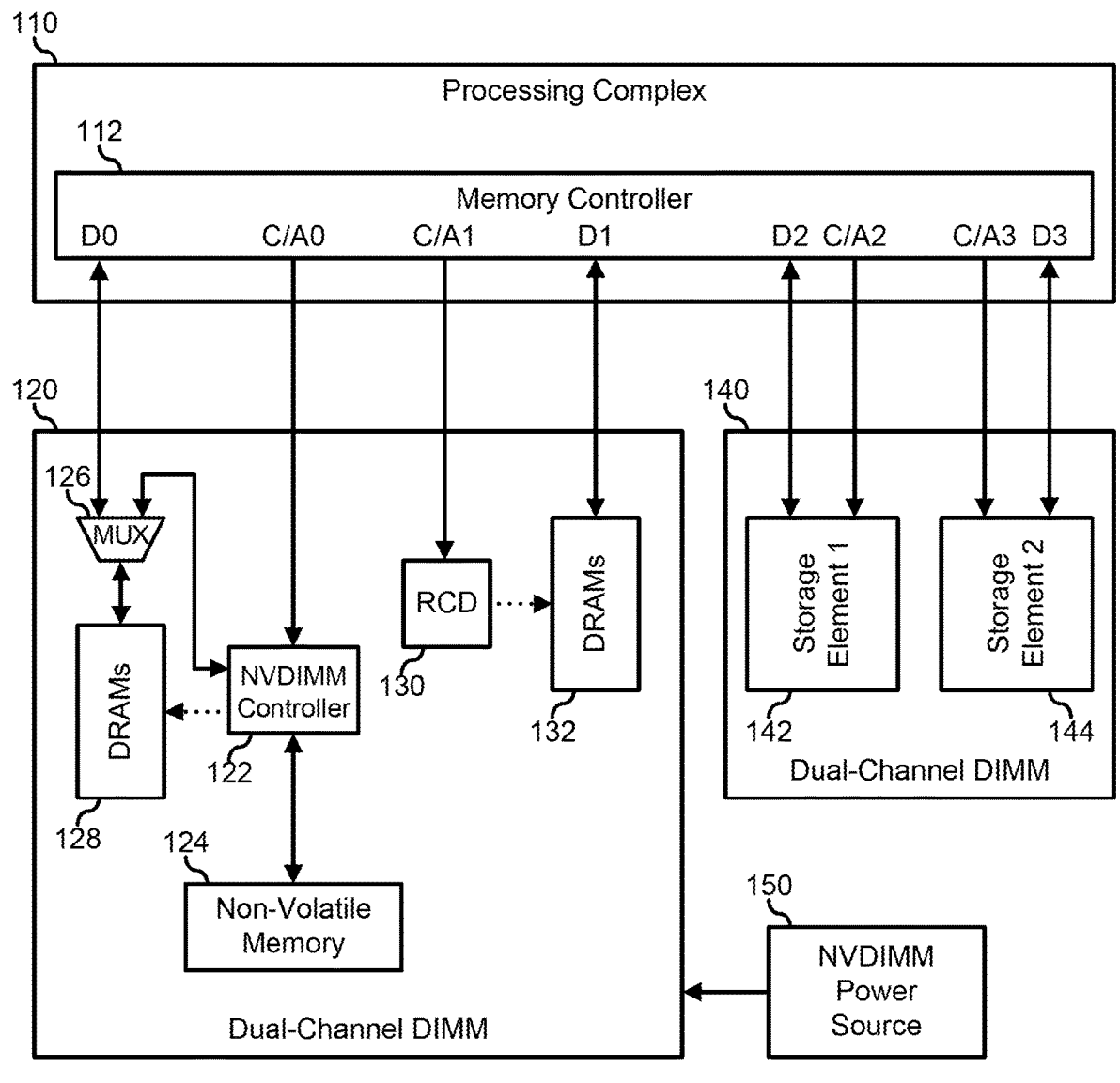
FIG. 1 is a block diagram illustrating an information handling system that has a four-channel memory architecture, and that includes heterogeneous dual-channel DIMMs according to an embodiment of the present disclosure.

FIG. 1 illustrates an embodiment of an information handling system 100. For purpose of this disclosure information handling system 100 can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 100 can include processing resources for executing machine-executable code, such as a central processing unit (CPU), a programmable logic array (PLA), an embedded device such as a System-on-a-Chip (SoC), or other control logic hardware. Information handling system 100 can also include one or more computer-readable medium for storing machine-executable code, such as software or data. Additional components of information handling system 100 can include one or more storage devices that can store machine-executable code, one or more communications ports for communicating with external devices, and various input and output (I/O) devices, such as a keyboard, a mouse, and a video display. Information handling system can 100 also include one or more buses operable to transmit information between the various hardware components.

Fifth generation dual-channel Dual In-Line Memory Modules (DIMMs) operate to provide data storage on memory storage devices that are accessed via two separate and independent memory channels. Due to cost and power constraints on information handling system 100, the number and configurations of standard dual-channel DIMMs, where the memory elements of each channel are homogeneous in size, type, topology, and functionality, may provide for inefficient memory configurations that are not desirable.

Information handling system 100 includes a processing complex 110, a fifth generation heterogeneous dual-channel Dual In-Line Memory Module (DIMM) 120, a heterogeneous dual-channel DIMM 140, and a NVDIMM power source 150.

Information handling system 100 is implemented as a four-channel architecture. Processing complex 110 includes a hardware memory controller 112. Processing complex 110 represents the hardware, software, firmware, and other elements associated with the performance of the processing tasks associated with information handling system. As such, processing complex 110 may be understood to include one or more data processors or processing cores, one or more input/output (I/O) devices such as processor, memory, or I/O controller hub, system memory including random access memory (RAM) and system read-only memory (ROM), mass data storage devices, video processors, network interface devices, or other devices typical to an information handling system, as needed or desired. Memory controller 112 represents a device of processing complex 110 that manages the flow of data going to and from dual-channel DIIMMs 120 and 140. Memory controller 112 is configured to implement a four-channel architecture. As such, memory controller 112 is connected to dual-channel SIMM 120 via two memory channels (channels 0 and 1), and is connected to dual-channel DIMM 140 via two additional memory channels (channels 2 and 3). Each memory channel includes a data bus (D #) and a control/address bus (C/A #). An example of a dual-channel DIMM includes a fifth generation Dual Data Rate (DDR5) DIMM.

Dual-channel DIMM 120 represents a DIMM device with heterogeneous storage element types, including non-volatile DIMM (NVDIMM) storage elements that are connected to the memory channel 0, and Dynamic Random Access Memory (DRAM) storage elements that are connected to memory channel 1. The NVDIMM storage elements include a NVDIMM controller 122, a non-volatile memory device 124, a memory channel multiplexor 126, and a DRAM device 128. NVDIMM controller 122 includes a command input connected to command and address bus C/A0 to receive command and address information from memory controller 112 for memory channel 0, and a command and address output connected to DRAM device 128 to provide command and address information to the DRAM device. NVDIMM controller 122 also includes a command/address/data interface, and a data interface. Non-volatile memory device 124 is connected to the command/address/data interface of NVDIMM controller 122 to receive command and address information from the NVDIMM controller and to transfer data between the NVDIMM controller and the non-volatile memory device. Memory channel multiplexor 126 includes a multiplexed data interface connected to DRAM device 128, a first data interface connected to the data bus D0 of memory controller 112 to selectably transfer data between the memory controller and DRAM device 128, a second data interface connected to the data interface of NVDIMM controller 122 to selectably transfer data between the NVDIMM controller and the DRAM device. Note that, as shown and described herein, DRAM device 128 is a single DRAM device, but the skilled artisan will recognize that the NVDIMM storage elements will typically include more than one DRAM device, as needed or desired. Further non-volatile memory device 124 is shown and described as a single non-volatile memory device, but this is not necessarily so, and the NVDIMM storage elements may include more than one non-volatile memory device, as needed or desired. In a particular embodiment, the NVDIMM storage elements represent a JEDEC Standard NVDIMM-N type NVDIMM that provides for address mapped access to DRAM device 128 to provide data storage under normal operating conditions for information handling system 100.

The DRAM storage elements of dual-channel DIMM 120 include a register control device (RCD) 130 and a DRAM device 132. The DRAM storage elements of dual-channel DIMM 120 are illustrated herein as including RCD 130, and the functions and features of operation of DRAM storage elements are illustrated and described within the context of a RDIMM, but this is not necessarily so, and the skilled artisan will understand that the functions and features of operation of DRAM storage elements as described herein may be provided in other ways, such as by a Programmable Logic Device (PLD), as needed or desired by the particular design of the dual-channel DIMM. RCD 130 includes a command input connected to command and address bus C/A1 to receive command and address information from memory controller 112 for memory channel 1, and a command and address output connected to DRAM device 132. DRAM device 132 includes a data interface connected to the data bus D1 of memory controller 112 to transfer data between the memory controller and the DRAM device. Note that, as shown and described herein, DRAM device 132 is a single DRAM device, but the skilled artisan will recognize that the NVDIMM storage elements will typically include more than one DRAM device, as needed or desired. An example of the DRAM storage elements of dual-channel DIMM 120 includes an unbuffered DIMM (UDIMM), a registered DIMM (RDIMM), a load reduced DIMM (LRDIMM), a storage class memory (SCM), or another type of fifth generation DIMM.

In normal operation, memory transactions for memory locations associated with DRAM device 128 are conducted on memory channel 0 and memory transactions for memory locations associated with DRAM devices 132 are conducted on memory channel 1. For example, a memory read to a memory location associated with DRAM device 128 will start with memory controller 112 presenting command and address information on C/A0. NVDIMM controller 122 will provide the command and address information to DRAM device 128 and set multiplexor 126 to permit data transfers between memory controller 112 and the DRAM device, and the DRAM devices will provide the read data from the addressed memory location to memory controller 112 on data bus D0. In another example, a memory write to a memory location associated with DRAM device 132 will start with memory controller 112 presenting command and address information on C/A1 and the write data on data bus D1. RCD 130 will provide the command and address information to DRAM device 132 and the DRAM device will read the data from D1 and store the data to the addressed memory location.

Under certain operating conditions, such as in the event of a loss of system power, the data stored in DRAM device 128 is saved to non-volatile memory device 124. Later, such as when the system power is restored, the data stored in non-volatile memory device 124 is restored to DRAM device 128. In another embodiment, the NVDIMM storage elements represent a JEDEC Standard NVDIMM-F type NVDIMM that provides for block based access to non-volatile memory device 124, but that used DRAM device 128 as a cache for the data stored on the non-volatile memory device. In yet another embodiment, the NVDIMM storage elements represent a JEDEC Standard NVDIMM-P type NVDIMM that provides for address mapped access to DRAM device 128 and for block based access to non-volatile memory device 124.

Information handling system 100 operates to provide for a save data operation to be performed for the data stored on the NVDIMM storage elements of dual-channel DIMM 120.

Here, an event, such as a loss of system power, can trigger the save data operation. The save data operation can include steps by processing complex 110, such as the flushing of the processor caches to DRAM device 128. After processing complex 110 is finished with memory transactions, memory controller 112 initiates an Asynchronous DRAM Refresh (ADR) mode on the NVDIMM storage elements of dual-channel DIMM 120, and the dual-channel DIMM proceeds to save the data from DRAM device 128 to non-volatile memory device 124. In the ADR mode, multiplexor 126 is set to connect DRAM device 128 to NVDIMM controller. In this way, DRAM device 128 is isolated from memory controller 112. NVDIMM controller 122 then reads the data from DRAM devices 128 and stores the data to non-volatile memory device 124. In the ADR mode, the NVDIMM storage elements of dual-channel DIMM 120 receive power from NVDIMM power source 150 to perform the data reads from DRAM devices 128, and to store the data to non-volatile memory device 124. In a particular embodiment, NVDIMM power source 150 represents a battery device that is dedicated to the NVDIMM storage elements of dual-channel DIMM 120 and any other NVDIMM devices of information handling system 100, as needed or desired, in order to conduct the save data operation on the information handling system. In another embodiment, NVDIMM power source 150 represents one or more super-capacitors that are configured to provide power to the NVDIMM storage elements of dual-channel DIMM 120 and any other NVDIMM devices of information handling system 100, as needed or desired, in order to conduct the save data operation on the information handling system.

Following a save data operation, for example, when system power is restored, information handling system 100 performs a system reboot. As part of the system reboot, information handling system 100 performs memory initialization operations that include a memory restore operation to restore any data stored in non-volatile memory device 124 back to DRAM device 128. In the memory restore operation, multiplexor 126 is set to connect DRAM device 128 to NVDIMM controller 122. In this way, DRAM device 128 is isolated from memory controller 112. NVDIMM controller 122 then reads the data that was stored from DRAM devices 128 on non-volatile memory device 124, and stores the data to the DRAM device. Note that, as illustrated, DRAM device 128 is isolated from memory controller 112 by selecting to connect the DRAM device to NVDIMM controller 122 via multiplexor 126, but this is not necessarily so. In another embodiment, a DRAM device similar to DRAM device 128 represent a dual-port device. Here, NVDIMM storage elements of a dual-channel DIMM similar to dual-channel DIMM 120 do not include a multiplexor similar to multiplexors 126. Instead, for each DRAM device, a first port of the DRAM device is directly connected to a memory controller similar to memory controller 112, and a second port of the DRAM device is directly connected to a NVDIMM controller similar to NVDIMM controller 122. Here, when the DRAM device is to be isolated from the memory controller, the dual-channel DIMM is configured such that the DRAM device ignores activity on its first port, thereby effectively isolating the DRAM device from the memory controller. Other memory configurations may be utilized in providing DRAM devices and flash memory devices, as needed or desired.

Dual-channel DIMM 140 represents a DIMM device with heterogeneous storage element types, including a first type of storage element 142 that is connected to the memory channel 2, and a second type of storage element 144 that is connected to the memory channel 3. Storage element 142 is of a storage element type that is chosen to provide an associated functionality which, in combination with a different functionality associated with the storage element type of storage element 144, combines to provide unique memory storage architectures to information handling system 100 that would not otherwise be available if the storage element types of storage elements 142 and 144 were the same, as is the case with typical homogeneous dual-channel DIMMs. Some non-limiting examples of storage element types include various basic DIMM types, such as the DIMM types mentioned above (UDIMM, RDIMM, LRDIMM, and SCM) or other basic DIMM types. In particular, storage elements of the first channel can be of a particular type and have a particular capacity, and storage elements of the second channel can be of the same type, but have a different capacity. Other non-limiting examples of storage element types include various NVDIMM types, such as the NVDIMM types mentioned above (NVDIMM-N, NVDIMM-P, and NVDIMM-F) or other NVDIMM types. Still other non-limiting examples of storage element types include various types of non-volatile Random Access Memory (NVRAM), such as flash memory, 3D XPoint memory, or other NVRAM types. Further, storage elements 142 and 144 may be of any combination of the above represented storage element types, and is not intended to be limited as to any broad category, such as two different types of basic DIMMs or two different types of NVDIMMs. Instead, the combination of storage element types is chosen to provide a high scale of adaptability for mixing and matching storage element types to suit the needs or desires of the user.

For example, information handling system 100 could be provided with dual-channel DIMM 120, where the NVDIMM storage elements can be utilized for mission critical information that would need to be preserved in the event of power loss, and where the DRAM storage elements can be selected to be of a particularly fast memory type for use as a system level cache. Further, dual-channel DIMM 140 can be configured where storage element 142 is selected as a NVRAM that stores BIOS and an operating system for information handling system 100, and where storage element 144 is selected as a larger, slower, type of basic DIMM for bulk data storage. In this way, information handling system 100 can be configured without an external storage device, such as a disk drive or a flash drive, because so many core storage functions are handled on the differently configured dual-channel DIMMs 120 and 140. Further, system configuration is easily tracked and maintained because each type of memory access is processed and handled on a different memory channel: critical data on memory channel 0, system level cache on memory channel 1, persistent storage on memory channel 2, and bulk data storage on memory channel 3.

In a particular embodiment, the distinction between the storage element types of storage elements 142 and 144 is based not upon differences in the types of memory devices utilized. For example, both of storage elements 142 and 144 may be of a common basic DIMM type, such as RDIMM, but each of the storage elements may be based upon different types of DRAM devices. In a first case, storage element 142 may be configured as a RDIMM that utilizes 4-bit DRAM devices, while storage element 144 may be configured as a RDIMM that utilizes 8-bit DRAM devices. In another case, the DRAM devices of storage element 142 may be of a different density than the storage devices of storage element 144. In yet another case, the RDIMM of storage element 142 can include Error Correcting Code (ECC) bits, and may be used for higher reliability storage, while the RDIMM of storage element 144 can be configure without ECC bits. In yet another case, the RDIMM of storage element 142 can be configured to operate at a first operating voltage, while the RDIMM of storage element 144 can be configured to operate at a second operating voltage that is different from the first operating voltage. In this case, dual-channel DIMM 140 can include one or more voltage regulators configured to provide one or more of the first and second operating voltages.

Figure 2:
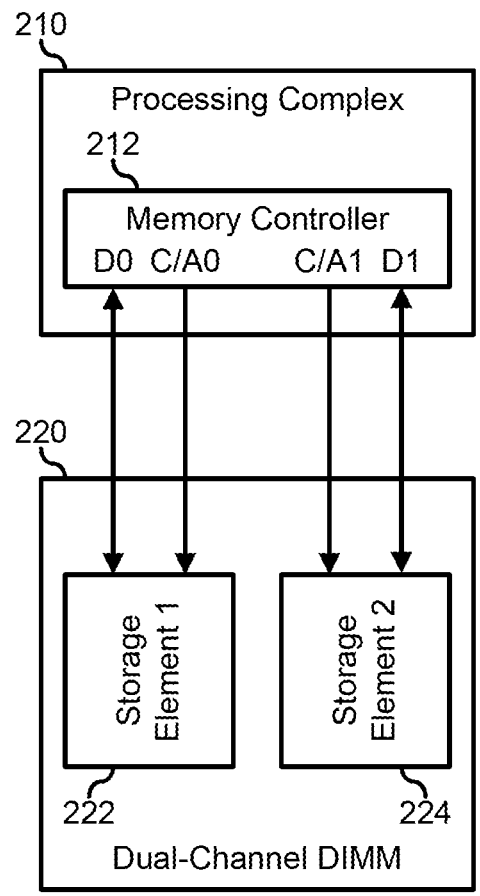
FIG. 2 is a block diagram illustrating an information handling system similar to the information handling system of FIG. 1.

FIG. 2 illustrates an information handling system 100 similar to information handling system 100, except that information handling system 100 includes only a single dual-channel connector for receiving only a single dual-channel DIMM. Here, information handling system 200 includes a processing complex 210 similar to processing complex 110. Processing complex 210 includes a memory controller 212, similar to memory controller 112, except that, where memory controller 110 implements a four-channel architecture, memory controller 212 implements a two-channel architecture, including a memory channel 0 and a memory channel 1. Further, dual-channel DIMM 220 is similar to dual-channel DIMMs 120 and 140. An example of information handling system 200 may include a dense server configuration of a client system configuration.

Information handling system 200 is designed as a constrained system to meet a particular performance goal. For example, the fact that information handling system 100 has only a single dual-channel connector for receiving a single dual-channel DIMM may be based upon a compact form factor or, particular power profile, a processing performance target, ease of maintenance considerations, or other considerations, as needed or desired. In this regard, the fact that dual-channel DIMM 220 is a heterogeneous DIMM provides unique flexibility in the design and operation of information handling system 100. For example, where the design of information handling system 100 is focused on creating a small, light weight system that dispenses with a multiplicity of external connectors, a particular dual-channel DIMM 220 can be selected where storage element 222 can be a NVRAM type of storage element, and where storage element 224 can be DIMM type of storage element. In this way, system BIOS, firmware, and an operating system can be stored on storage element 222 (the NVRAM), and runtime data handling can be provided by storage element 224 (the DIMM). In another example, where the design of information handling system 100 is focused on creating a low power system, a different dual-channel DIMM 220 can be selected where storage element 222 can be a large, slow, but low-power DIMM type of storage element, and where storage element 224 can be a small, fast DIMM type of storage element. The skilled artisan will recognize that the particular examples cited herein are not meant to be limiting, and that such knowledge and skill in selecting different types of DIMMs in a conventional information handling system can be utilized in selecting the storage element types with which to configure dual-channel DIMM 220.

Figure 3:
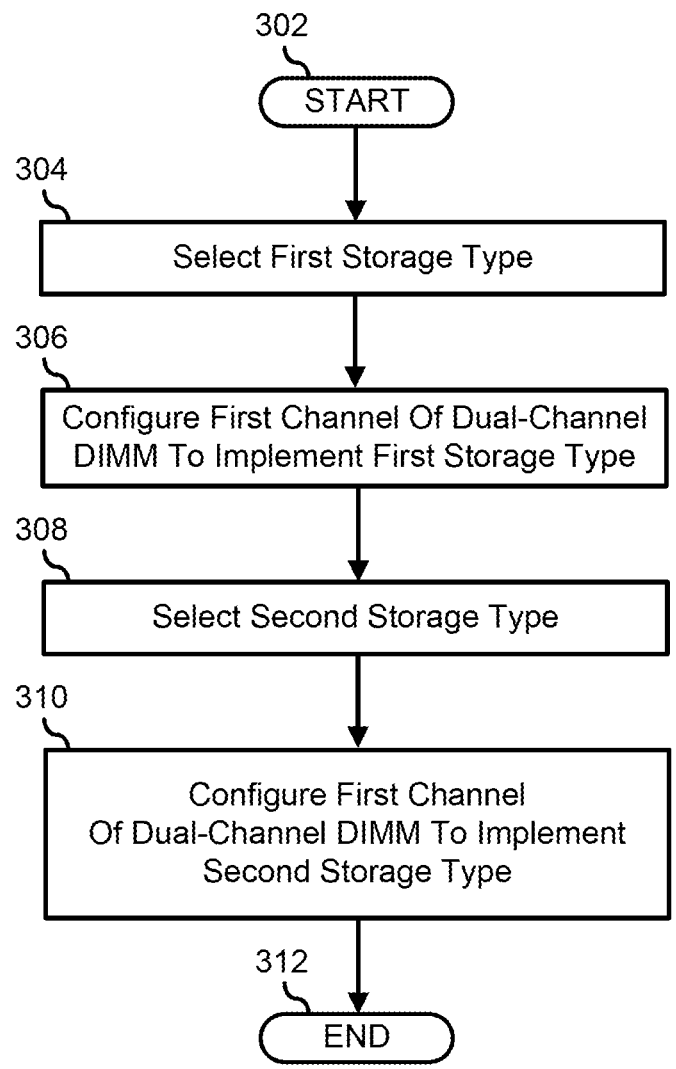
FIG. 3 is a flowchart illustrating a method for providing a heterogeneous dual-channel DIMM according to an embodiment of the present disclosure.

FIG. 3 illustrates a method for providing a heterogeneous dual-channel DIMM starting at block 302. A first storage type is selected for a dual-channel DIMM design in block 304. For example, a storage element of a dual-channel DIMM design can be selected from the types of memory elements described above. The dual-channel DIMM is configured such that the first storage type is coupled to the first memory channel of the dual-channel DIMM in block 306. A second storage type is selected for the dual-channel DIMM design in block 308. The dual-channel DIMM is configured such that the first storage type is coupled to the second memory channel of the dual-channel DIMM in block 310 and the method ends in block 312.

Figure 4:
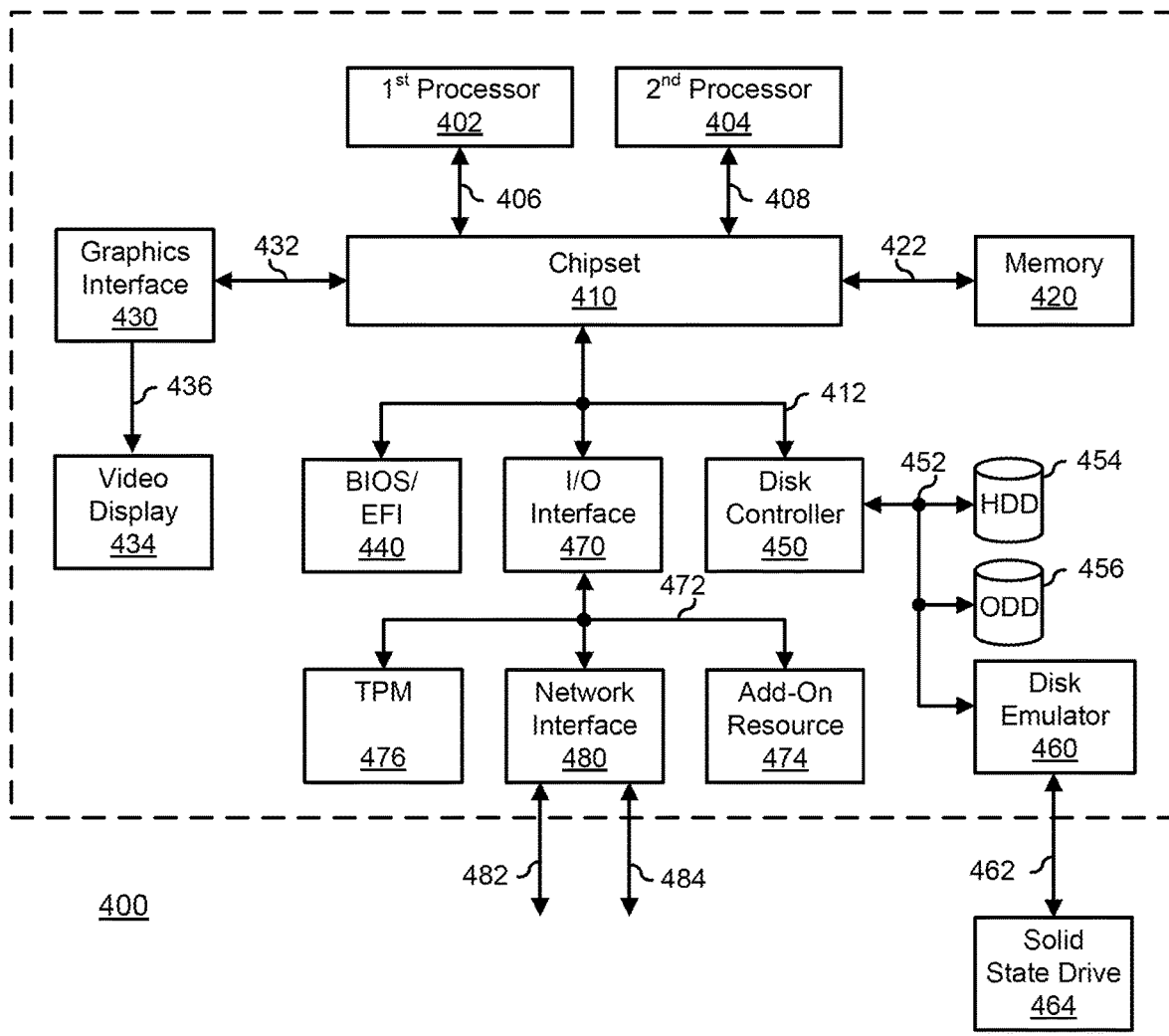
FIG. 4 is a block diagram illustrating a generalized information handling system according to an embodiment of the present disclosure.

FIG. 4 illustrates a generalized embodiment of information handling system 400. Information handling system 400 can include devices or modules that embody one or more of the devices or modules described above, and operates to perform one or more of the methods described above. Information handling system 400 includes a processors 402 and 404, a chipset 410, a memory 420, a graphics interface 430, include a basic input and output system/extensible firmware interface (BIOS/EFI) module 440, a disk controller 450, a disk emulator 460, an input/output (I/O) interface 470, and a network interface 480. Processor 402 is connected to chipset 410 via processor interface 406, and processor 404 is connected to the chipset via processor interface 408. Memory 420 is connected to chipset 410 via a memory bus 422. Graphics interface 430 is connected to chipset 410 via a graphics interface 432, and provides a video display output 436 to a video display 434. In a particular embodiment, information handling system 400 includes separate memories that are dedicated to each of processors 402 and 404 via separate memory interfaces. An example of memory 420 includes random access memory (RAM) such as static RAM (SRAM), dynamic RAM (DRAM), non-volatile RAM (NV-RAM), or the like, read only memory (ROM), another type of memory, or a combination thereof.

BIOS/EFI module 440, disk controller 450, and I/O interface 470 are connected to chipset 410 via an I/O channel 412. An example of I/O channel 412 includes a Peripheral Component Interconnect (PCI) interface, a PCI-Extended (PCI-X) interface, a high speed PCI-Express (PCIe) interface, another industry standard or proprietary communication interface, or a combination thereof. Chipset 410 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. BIOS/EFI module 440 includes BIOS/EFI code operable to detect resources within information handling system 400, to provide drivers for the resources, initialize the resources, and access the resources. BIOS/EFI module 440 includes code that operates to detect resources within information handling system 400, to provide drivers for the resources, to initialize the resources, and to access the resources.

Disk controller 450 includes a disk interface 452 that connects the disc controller to a hard disk drive (HDD) 454, to an optical disk drive (ODD) 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits a solid-state drive 464 to be connected to information handling system 400 via an external interface 462. An example of external interface 462 includes a USB interface, an IEEE 1394 (Firewire) interface, a proprietary interface, or a combination thereof. Alternatively, solid-state drive 464 can be disposed within information handling system 400.

I/O interface 470 includes a peripheral interface 472 that connects the I/O interface to an add-on resource 474, to a TPM 476, and to network interface 480. Peripheral interface 472 can be the same type of interface as I/O channel 412, or can be a different type of interface. As such, I/O interface 470 extends the capacity of I/O channel 412 when peripheral interface 472 and the I/O channel are of the same type, and the I/O interface translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as chipset 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A fifth generation Double Data Rate (DDR5) Dual In-Line Memory Module (DIMM), comprising:
    a first memory element configured to perform memory transactions for first memory locations associated with the first memory element via a first memory channel of the DDR5 DIMM, wherein the first memory channel includes a first command/address bus and a first data bus; and
    a second memory element configured to perform memory transactions for second memory locations associated with the second memory element via a second memory channel of the DDR5 DIMM, wherein the second memory channel includes a second command/address bus and a second data bus, wherein the first memory channel is different than the second memory channel, wherein the first memory locations are different than the second memory locations, and wherein the first memory element is a different type of memory element than the second memory element.

2. The DDR5 DIMM of claim 1, wherein the first memory element comprises a non-volatile DIMM (NVDIMM) type of memory element.

3. The DDR5 DIMM of claim 2, wherein the first memory element further comprises a JEDEC Standard NVDIMM-N type NVDIMM.

4. The DDR5 DIMM of claim 2, wherein the first memory element further comprises a JEDEC Standard NVDIMM-P type NVDIMM.

5. The DDR5 DIMM of claim 2, wherein the first memory element further comprises a JEDEC Standard NVDIMM-F type NVDIMM.

6. The DDR5 DIMM of claim 2, wherein the second memory element comprises a basic DIMM type of memory element.

7. The DDR5 DIMM of claim 6, wherein the basic DIMM type comprises one of an unbuffered DIMM (UDIMM), a registered DIMM (RDIMM), a load reduced DIMM (LRDIMM), and a storage class memory (SCM).

8. The DDR5 DIMM of claim 1, wherein the first memory element comprises a basic DIMM type of memory element, and wherein the second memory element comprises a non-volatile random access memory (NVRAM) type of memory element.

9. The DDR5 DIMM of claim 1, wherein the first memory element comprises a basic DIMM type of memory element that utilizes a first type of Dynamic Random Access Memory (DRAM) device, and wherein the second memory element comprises the basic DIMM type of memory element that utilizes a second type of DRAM device.

10. The DDR5 DIMM of claim 1, wherein the first memory element comprises a basic DIMM type of memory element that utilizes an Error Correcting Code (ECC), and wherein the second memory element comprises the basic DIMM type of memory element that does not utilize the ECC.

11. A method of providing a fifth generation Double Data Rate (DDR5) Dual In-Line Memory Module (DIMM), the method comprising:
    selecting a first type of memory type for a first memory element of the DDR5 DIMM;
    configuring the DDR5 DIMM to couple the first memory element to a first memory channel of the DDR5 DIMM;
    performing memory transactions for first memory locations associated with the first memory element via the first memory channel, wherein the first memory channel includes a first command/address bus and a first data bus;
    selecting a second type of memory type for a second memory element of the DDR5 DIMM, wherein the second memory channel includes a second command/address bus and a second data bus, wherein the first memory element is a different type of memory element than the second memory element;
    configuring the DDR5 DIMM to couple the second memory element to a second memory channel of the DDR5 DIMM, wherein the first memory channel is different than the second memory channel; and performing memory transactions for second memory locations associated with the second memory element via the second memory channel, wherein the first memory locations are different than the second memory locations.

12. The method of claim 11, wherein the first memory element comprises a non-volatile DIMM (NVDIMM) type of memory element, and wherein the second memory element comprises a basic DIMM type of memory element.

13. The method of claim 11, wherein the first memory element comprises a basic DIMM type of memory element, and wherein the second memory element comprises a non-volatile random access memory (NVRAM) type of memory element.

14. The method of claim 11, wherein the first memory element comprises a basic DIMM type of memory element that utilizes a first type of Dynamic Random Access Memory (DRAM) device, and wherein the second memory element comprises the basic DIMM type of memory element that utilizes a second type of DRAM device.

15. The method of claim 11, wherein the first memory element comprises a basic DIMM type of memory element that utilizes an Error Correcting Code (ECC), and wherein the second memory element comprises the basic DIMM type of memory element that does not utilize the ECC.

16. An information handling system, comprising:
a dual channel fifth generation Double Data Rate (DDR5) memory controller; and
a DDR5 Dual In-Line Memory Module (DIMM), including:
a first memory element configured to perform memory transactions for first memory locations associated with the first memory element via a first memory channel of the DDR5 memory controller, wherein the first memory channel includes a first command/address bus and a first data bus; and
a second memory element configured to perform memory transactions for second memory locations associated with the second memory element via a second memory channel of the DDR5 memory controller, wherein the second memory channel includes a second command/address bus and a second data bus, wherein the first memory channel is different than the second memory channel, wherein the first memory locations are different than the second memory locations, and wherein the first memory element is a different type of memory element than the second memory element.

17. The information handling system of claim 16, wherein the first memory element comprises a non-volatile DIMM (NVDIMM) type of memory element, and wherein the second memory element comprises a basic DIMM type of memory element.

18. The information handling system of claim 16, wherein the first memory element comprises a basic DIMM type of memory element, and wherein the second memory element comprises a non-volatile random access memory (NVRAM) type of memory element.

19. The information handling system of claim 16, wherein the first memory element comprises a basic DIMM type of memory element that utilizes a first type of Dynamic Random Access Memory (DRAM) device, and wherein the second memory element comprises the basic DIMM type of memory element that utilizes a second type of DRAM device.

20. The information handling system of claim 16, wherein the first memory element comprises a basic DIMM type of memory element that utilizes an Error Correcting Code (ECC), and wherein the second memory element comprises the basic DIMM type of memory element that does not utilize the ECC.

* * * * *